United States Patent [19]
Ogawa et al.

[11] Patent Number: 5,572,173
[45] Date of Patent: Nov. 5, 1996

[54] LADDER TYPE FILTER WITH ADJUSTABLE RESONATOR POSITIONING MEMBER

[75] Inventors: Tatsuo Ogawa; Yasuhiko Nakagawa; Junji Kawai, all of Nagoya, Japan

[73] Assignee: NGK Spark Plug Co., Ltd., Aichi-ken, Japan

[21] Appl. No.: 388,417

[22] Filed: Feb. 14, 1995

[30] Foreign Application Priority Data

Feb. 15, 1994 [JP] Japan ................................... 6-042051
Feb. 15, 1994 [JP] Japan ................................... 6-042052

[51] Int. Cl.⁶ ........................................... H03H 9/205
[52] U.S. Cl. ............................................ 333/187; 333/189
[58] Field of Search ............................... 333/187–192; 310/348

[56] References Cited

U.S. PATENT DOCUMENTS

| | | | |
|---|---|---|---|
| 4,864,259 | 9/1989 | Takamoro et al. | 333/189 |
| 5,260,675 | 11/1993 | Ogawa et al. | 333/189 |
| 5,392,012 | 2/1995 | Iwata et al. | 333/189 |
| 5,426,401 | 6/1995 | Ogawa et al. | 333/188 |

FOREIGN PATENT DOCUMENTS 6164307  6/1994  Japan.
6204786  7/1994  Japan.

*Primary Examiner*—Benny Lee
*Assistant Examiner*—Darius Gambino
*Attorney, Agent, or Firm*—Larson and Taylor

[57] ABSTRACT

There is provided a ladder type electric filter having a pair of vertically arranged parallel resonators and a pair of series resonators arranged side by side above the parallel resonators and, at the same time, held free from degradation in the performance of the filter, wherein the abutting surfaces of the raised connecting sections of a connecting terminal member that are held in close contact with the respective lower surface-electrodes of the series resonators partly overlap with the abutting surface of the raised connecting section of an output terminal member that is held in close contact with the upper surface-electrode of the upper parallel resonator if viewed from above. A pair of position controlling projections are formed on an insulating shield plate for hermetically sealing the opening of a casing and the centers of the series resonators are respectively defined by the rear end walls of the space regions of the casing so that the centers of the series resonators, those of the parallel resonators and the raised connecting sections, are longitudinally aligned.

5 Claims, 8 Drawing Sheets

LADDER TYPE FILTER WITH ADJUSTABLE RESONATOR POSITIONING MEMBER

BACKGROUND OF THE INVENTION

The present invention relates to a ladder type electric filter having series resonators and parallel resonators housed in a casing and designed to form a unit filter circuit to be mounted on a printed-circuit board. Such an electric filter can suitably be used for telecommunications equipment such as a portable wireless telephone or an automobile telephone.

A ladder type electric filter comprises series resonators and parallel resonators, in which one of the electrodes of each series resonator is connected to an input terminal and one of the electrodes of each parallel resonator is connected to a ground whereas the other electrode of each of the series and parallel resonators is connected to an output terminal of the filter. Ladder type electric filters of the known type include those comprising square series and parallel resonators having edges of about 5 mm and designed to operate in a contour oscillation mode at a center frequency of 455 KHz and those comprising circular series and parallel resonators having a diameter of about 5 mm and designed to operate in a radial oscillation mode also at a center frequency of 455 KHz.

In the current trend of reducing the weight and size of every piece of radio telecommunications equipment, ladder type electric filters to be used in filter circuits are required be as low as 0.01 mm in thickness. On the other hands, conventional ladder type electric filters have a multilayer or superimposed structure of parallel resonators and series resonators, and the height of such filters is inevitably large as each filter comprises a casing and terminal plates that significantly contribute to the overall height of arrangement, making it rather difficult for the filter to become thin.

In an attempt to meet the requirement of low profile, as shown in FIG. 1 of the accompanying drawings, there has been proposed an arrangement where a pair of square parallel resonators P1 and P2 designed to operate in a contour oscillation mode are vertically disposed in two layers with the lower surface-electrode of the upper resonator P2 and the upper surface-electrode of lower resonator P1 connected with each other by way of a grounded terminal plate 1, and a pair of oblong series resonators S1 and S2 designed to operate in a longitudinal oscillation mode are disposed side by side on the upper parallel resonator P2 with an insulating plate 2 arranged therebetween such that the lower surface-electrodes of the series resonators S1 and S2 are electrically connected to the lower surface-electrode of the lowermost parallel resonator P1 by way of a connecting terminal plate 3 while the upper surface-electrode of the series resonator S1 is connected to an input terminal plate 4 and the upper surface-electrode of the series resonator S2 is connected to the upper surface-electrode of the parallel resonator P2 by way of an output terminal plate 5. All the above mentioned components are contained in a casing provided with an opening, which is hermetically sealed by an insulating shield plate having slits, through which the connecting legs 1a, 4a and 5a of the grounded, input and output terminal plates 1, 4 and 5 are extended outwardly and connected to respective external electric circuits. With this arrangement, the filter can be made to show a rather low profile because the series resonators S1 and S2 are juxtaposed on the same level and the height of not two but a single series resonator is added to the overall height of the filter.

With the above described arrangement, the connecting terminal plate 3 to be connected to the series resonators S1 and S2 is provided with a pair of protuberances or raised connecting sections $3_{s1}$ and $3_{s2}$ in alignment with the respective centers of the series resonators S1 and S2. Additionally, the connecting terminal plate 3, the output terminal plate 5 and a connecting terminal plate 6 to be connected to the parallel resonators P1 and P2 are provided with respective raised connecting sections $3_{p1}$, $5_{p2}$ and $6_{p1}$ in alignment with the centers of the electrodes of the parallel resonators P1 and P2. In the words, while the raised connecting sections $3_{s1}$ and $3_{s2}$ of the connecting terminal plate 3 are separated from each other and arranged side by side, the raised connecting sections $3_{p1}$, $5_{p2}$ and $6_{p1}$ of the terminal plates 3, 5 and 6 to be connected to the parallel resonators P1 and P2 are positioned on the center of the latter.

In a conventional ladder type electric filter having a configuration as described above, the series resonators S1 and S2 are made shorter than the parallel resonators P1 and P2 because the series resonators S1 and S2 need to have respective lengths with which their resonant frequencies correspond to respective given the frequencies in a longitudinal oscillation mode whereas the parallel resonators P1 and P2 need to have a length with which their resonant frequencies correspond to respective given the frequencies in a contour oscillation mode. On the other hand, the raised connecting sections $3_{p1}$, $5_{p2}$ and $6_{p1}$ of the terminal plates 3, 5 and 6 are laterally aligned with the centers of the parallel resonators P1 and P2.

As a result and as shown in FIG. 2, when the components are assembled and housed in the casing, they are subjected to various pressures. More specifically, pressures p1 and p2 are applied to the connecting terminal 3 respectively by way of the raised connecting sections $3_{s1}$ and $3_{s2}$ that are held in close contact with the respective series resonators S1 and S2, while pressure p3 is applied to the center of the neighboring terminal plate 5 by way of the raised section $5_{P2}$ located at the middle of the raised sections $3_{s1}$ and $3_{s2}$ to make the terminal plates warp with the center of the raised connecting section $5_{P2}$ acting as the fulcrum. Consequently, the points at which the series resonators S1 and S2 contact respectively with the raised connecting sections $3_{s1}$ and $3_{s2}$ are laterally shifted. While the contact points of the raised connecting sections $3_{s1}$ and $3_{s2}$ are so selected as to correspond to the respective nodes (centers) of oscillation of the series resonators S1 and S2, the resonance characteristic of the filter is inevitably varied as the contact points are shifted.

Additionally, as illustrated in FIG. 3 schematically in a somewhat exaggerated manner, as the contact point of the raised connecting section ($3_{s1}$; $3_{s2}$) of the terminal plate 3 is positionally shifted relative to the center (fulcrum) O of each of the series resonators S1 and S2, the latter are subjected to a torque m as indicated by an arrow in FIG. 3 and tend to become inclined. As the series resonators S1 and S2 are inclined, their peripheral areas abut the casing 7 in an uneven manner to alter that the resonance characteristic of the series resonators and hence that of the filter as a whole. While this problem may be alleviated by aligning the raised connecting sections $3_{s1}$ and $3_{s2}$ of the terminal plate 3 with the centers of the series resonators S1 and S2, respectively, then a similar problem arises between the parallel resonators P1 and P2 and the corresponding raised connecting sections of the terminal plates that are held in contact with the respective parallel resonators.

It is, therefore, an object of the present invention to provide an improved ladder type electric filter that is free from the above identified problems or disadvantages.

SUMMARY OF THE INVENTION

According to an aspect of the present invention, there is provided a ladder type electric filter including a pair of square shape parallel resonators provided with respective upper and lower surface-electrodes and intended to be operated in a contour oscillation mode, the parallel resonators being arranged vertically one above the other, the lower surface-electrode of the upper parallel resonator and the upper surface-electrode of the lower parallel resonator being electrically connected with each other by means of a grounded terminal member, a pair of strip shape series resonators provided with respective upper and lower surface-electrodes and intended to be operated in a longitudinal oscillation mode, said series resonators being horizontally juxtaposed on the upper parallel resonator, the lower surface-electrodes of the series resonators being connected to the lower surface-electrode of the parallel resonator arranged at the bottom by means of a connecting terminal member, the upper surface-electrode of one of the series resonators being electrically connected to an input terminal member, the upper surface-electrode of the other series resonator being electrically connected to the upper surface-electrode of the upper parallel resonator by means of an output terminal member, and a casing for containing the parallel resonators, the series resonators and the terminal members and having an opening to be hermetically sealed by means of an insulating shield member provided with slits, the input, output and grounded terminal members having respective connecting legs which are outwardly extended through the slits of said insulating shield member, wherein the connecting terminal member is provided with a pair of raised connecting sections arranged side by side and having respective abutting surfaces to be held in close contact with the lower surface-electrodes of the series resonators, the output terminal member is provided with a raised connecting section and having a contacting surface to be held in close contact with the center of the upper surface-electrode of the upper parallel resonator, and the raised connecting sections of the connecting terminal member and the raised connecting section of the output terminal member are arranged so that the abutting surfaces of the connecting terminal member partly overlap with the contacting surface of the output terminal member if viewed from above.

According to another aspect of the invention, there is provided a ladder-type electric filter of type under consideration, wherein the insulating shield member is provided with position controlling projections intended to be held in abutment with the respective end portions of the series resonators disposed close to the opening of the casing for positioning the series resonators so that the centers of the series resonators along the longitudinal axes thereof are substantially aligned with the center of the upper parallel resonator along the longitudinal axis thereof, and the raised connecting sections of the terminal plates are arranged such that they are held in alignment with the centers of the resonators.

Each of the position controlling projections of the insulating shield member may have a free end for bounding a front end of each of the spaces of the casing where the series resonators are contained.

With the arrangement described above with regard to the first aspect of the invention, since the abutting surfaces of the raised connecting sections of the connecting terminal member that are held in dose contact with the respective lower surface-electrodes of the series resonators partly overlap with the abutting surface of the raised connecting section of the outupt terminal member that is held in dose contact with the upper surface-electrode of the upper parallel resonator if viewed from above, the connecting terminal member is subjected to even pressure if pressures are locally applied thereto between the two raised connecting sections so that consequently the connecting terminal member would never be warped and hence the resonance characteristic of the filter as a whole would not be varied.

Then, with the arrangement described above with regard to the second aspect of the invention, since the centers of the series resonators are longitudinally aligned with the center of the upper parallel resonator by controlling the locations of the rear end walls of the space regions of the casing where the series resonators are contained and those of the free ends of the position controlling projections and the raised connecting sections of the terminal plates are arranged such that they are held longitudinally alignment with the centers of the resonators in order to secure electric connection with the corresponding resonators, the resonators would never be subjected to a torque if pressures are applied to the resonators.

Now, the present invention will be described in detail with reference to the accompanying drawings that illustrate a preferred embodiment of the invention.

BRIEF DESCIPTION OF THE DRAWINGS

DETAILED DESCRIPTION OF THE INVENTION

Figure 4:
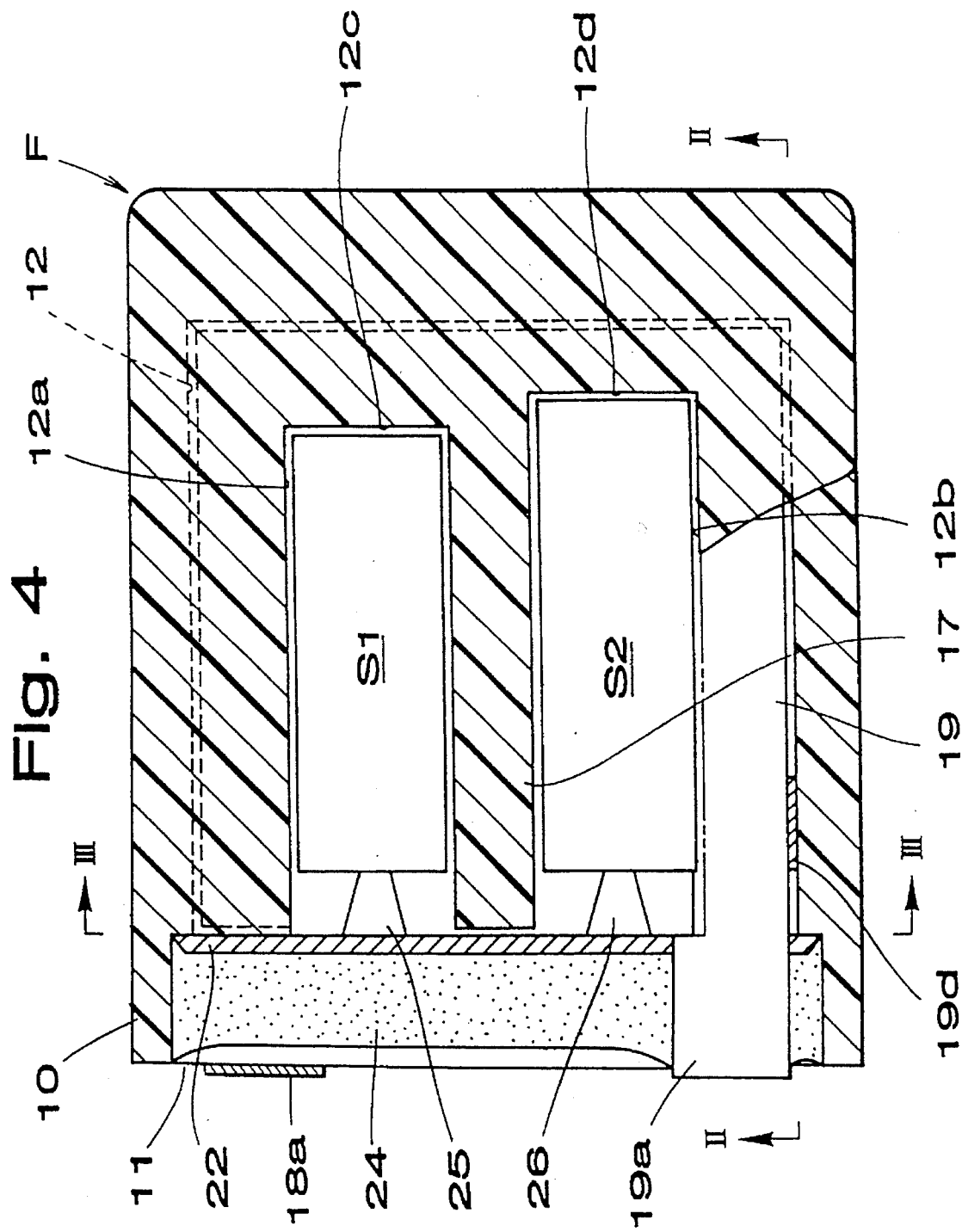
FIG. 4 is a schematic sectional view showing a preferred embodiment of a ladder type electric filter according to the invention taken along line I—I in FIG. 5.
Figure 5:
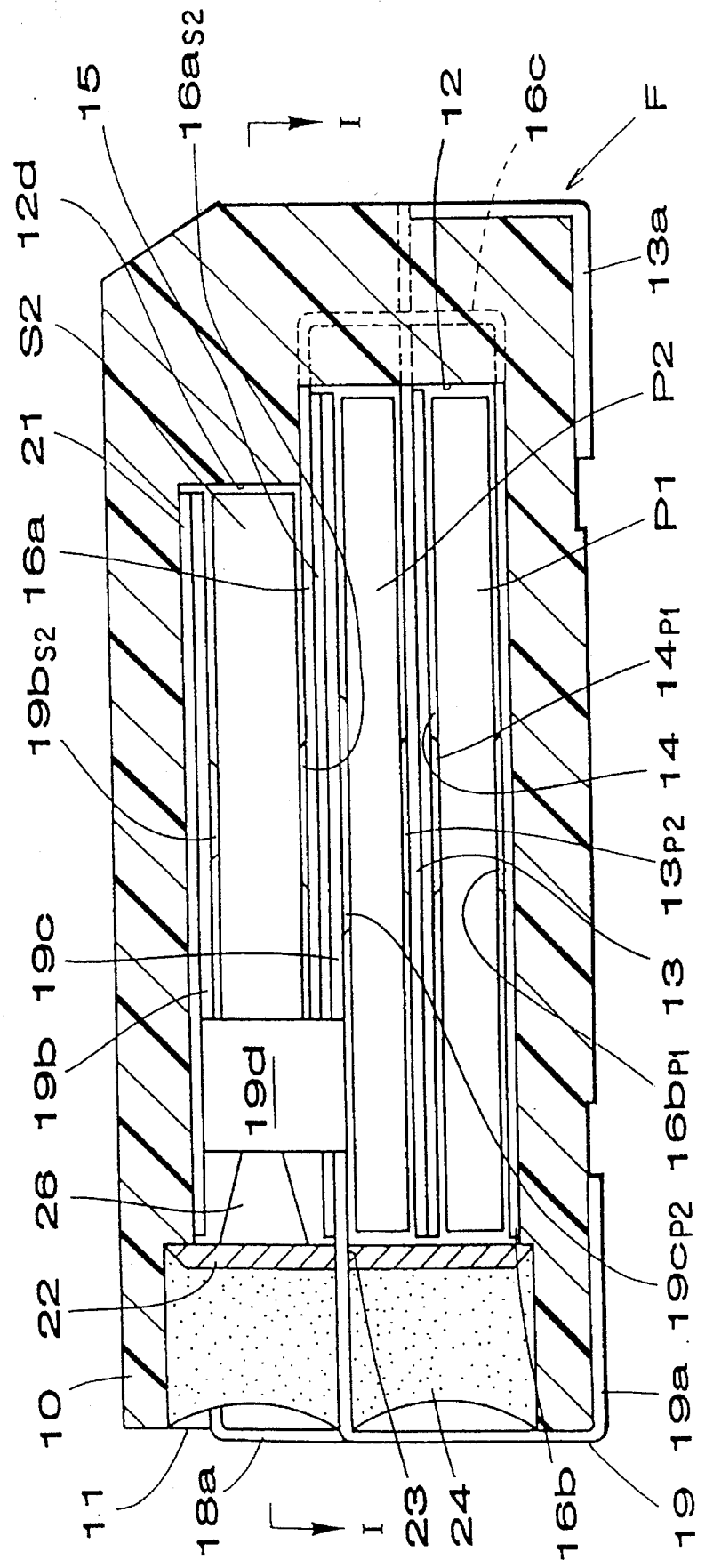
FIG. 5 is an enlarged schematic sectional view of the embodiment of FIG. 4 taken along line II—II in FIG. 4.
Figure 6:
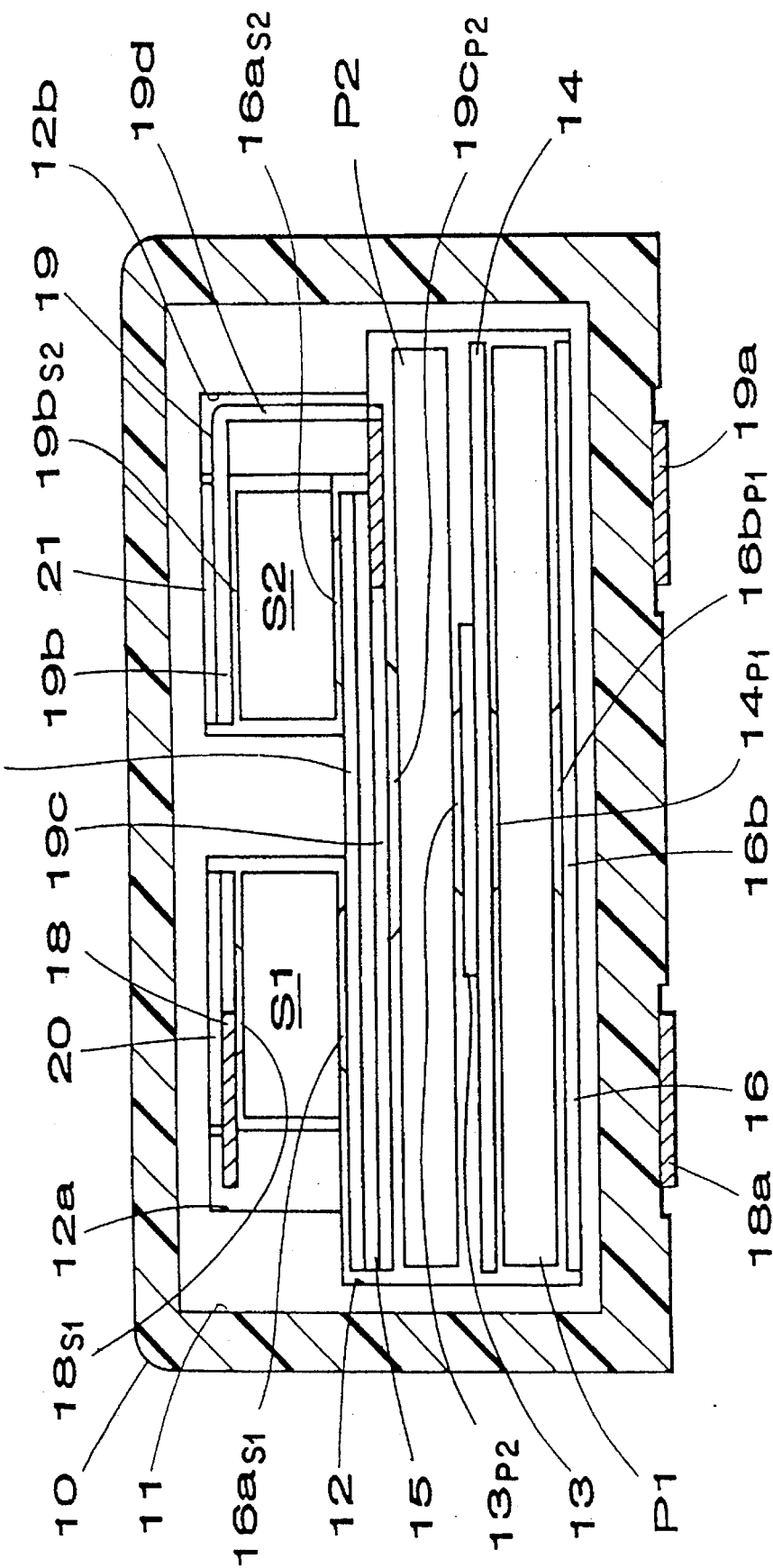
FIG. 6 is a schematic sectional view of the embodiment taken along line III—III in FIG. 4.

Referring to FIGS. 4 through 6 showing a preferred embodiment of the ladder type electric filter according to the invention, the filter is generally denoted by F and comprises a thin and rectangular parallel-epipedic casing 10 made of a synthetic resin material and having an opening 11 at a side thereof. The casing 10 contains a pair of square parallel resonators P1 and P2 and a pair of oblong series resonators S1 and S2 arranged in layers in a manner as described hereinafter in greater detail. Note that each of the series resonators S1 and S2 has a rather high profile while each of the parallel resonators P1 and P2 are made thin so that the former have a small electrostatic capacity relative to the latter, and that the parallel resonators P1 and P2 are square and have a large area reserved for the electrodes so that they may operate in a contour oscillation mode, which will be described hereinafter.

Figure 10:
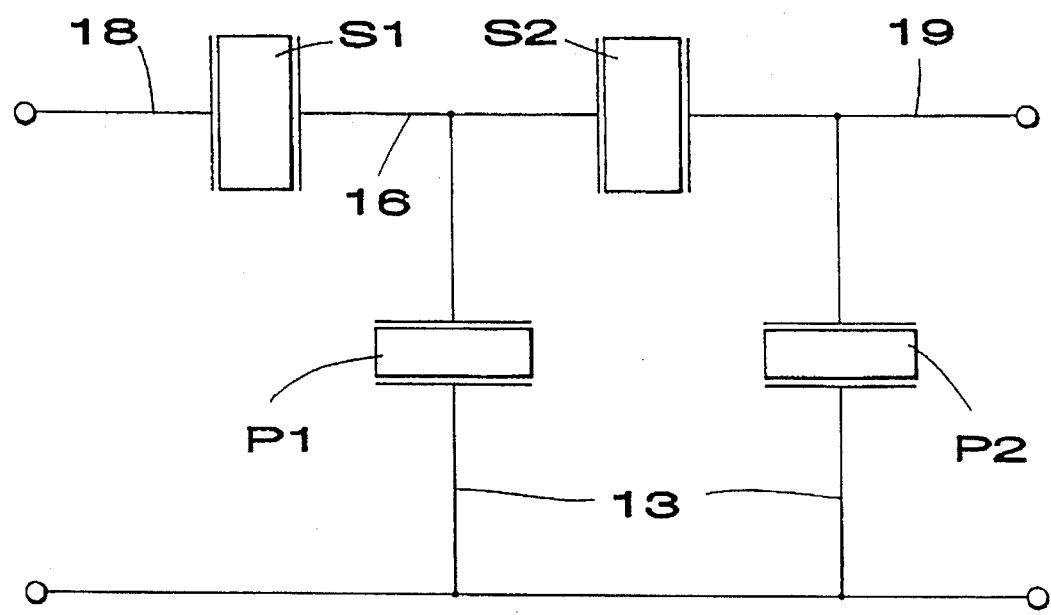
FIG. 10 is a schematic circuit diagram of a unit filter circuit formed by a ladder type electric filter according to the invention.

Each of the series resonators S1 and S2 has an oblong or strip shape, whose length is so determined that their main resonance frequency agrees with the center frequency of the ladder type electric filter as a whole in the longitudinal oscillation mode. On the other hand, the parallel resonators P1 and P2 are so designed that their antiresonance frequency is equal to the center frequency of the filter as a whole in the contour oscillation mode. The series resonators S1 and S2 and the parallel resonators P1 and P2 are arranged in a manner as shown in FIG. 10 to produce a unit filter circuit having a configuration that meets the requirements of a particular application.

Each of the series resonators S1 and S2 typically has a width of 1.5 mm, a length of about 3.8 mm (although the lengths of the series resonators S1 and S2 may slightly differ from each other as shown in FIG. 5) and a height of 0.50 mm, whereas each of the parallel resonators P1 and P2 has dimensions of 4.65 mm×4.65 mm×0.32 mm.

The components of the electric filter F are arranged in the inner space 12 of the casing 10 in a manner as described below.

The two square parallel resonators P1 and P2 to be used in the contour oscillation mode are arranged vertically with a grounded terminal plate 13 having a raised connecting section $13_{p2}$ and a connecting terminal plate 14 having a raised connecting section $14_{p1}$ arranged therebetween. The resonator P2 is disposed on the resonator P1, and the electrodes of the resonators P1 and P2 located vis-a-vis are electrically connected with each other via the grounded terminal plate 13. The grounded terminal plate 13 has a connecting leg 13a extended from an edge of the plate and the raised connecting section $14_{p1}$ of the square connecting plate 14 projects downward to establish electrical connection between the parallel resonators. The connecting leg 13a is molded integrally with the grounded terminal plate 13 and extended to the outside of the filter through the casing 10.

The oblong series resonators S1 and S2 are designed for use in the longitudinal oscillation mode and arranged side by side above the upper parallel resonator P2 in respective regions 12a and 12b defined in an upper part of in the inner space 12 of the casing 10 with an insulating plate 15 and a terminal segment 16a of a connecting terminal plate 16 arranged therebetween. The terminal segment 16a is provided with a pair of raised connecting sections $16a_{s1}$ and $16a_{s2}$ standing upward from the upper surface thereof and located side by side to establish electric connection between the terminal segment 16a and the series resonators S1 and S2. Note that the regions 12a and 12b of the inner space 12 are separated by a partition 17. The rear ends of the series resonators S1 and S2 are defined by the respective rear walls 12c and 12d of the space regions 12a and 12b so that the series resonators S1 and S2 may be correctly placed within the casing 10. The positioning of the series resonators S1 and S2 will be described in detail hereinafter.

The connecting terminal plate 16 comprises a pair of terminal segments 16a and 16b arranged in parallel with each other and an intermediate segment 16c for connecting the two terminal segments, of which the terminal segment 16b has a raised connecting section $16b_{p1}$ projecting upward to be held in close contact with the electrode on the lower surface of the parallel resonator P1. The electrode on the lower surface of the parallel resonator P1 is connected to the electrodes on the lower surfaces of the series resonators S1 and S2 by the connecting terminal plate 16. It should be noted that the connecting segment 16c of the connecting terminal plate 16 is buried in the casing 10 at the time of molding the latter.

An input terminal plate 18 is arranged above the series resonator S1. More specifically, the terminal plate 18 has a raised connecting section $18_{s1}$ projecting downward form the lower surface thereof which is held in contact with the upper electrode of the series resonator S1 and a connecting leg 18a extended from an edge of thereof by which the upper electrode of the series resonator S1 can be electrically connected to an input terminal of an external electric circuit not shown.

An output terminal plate 19 is provided for electrically connecting the upper surface-electrode of the series resonator S2 with that of the parallel resonator P2.

Figure 7:
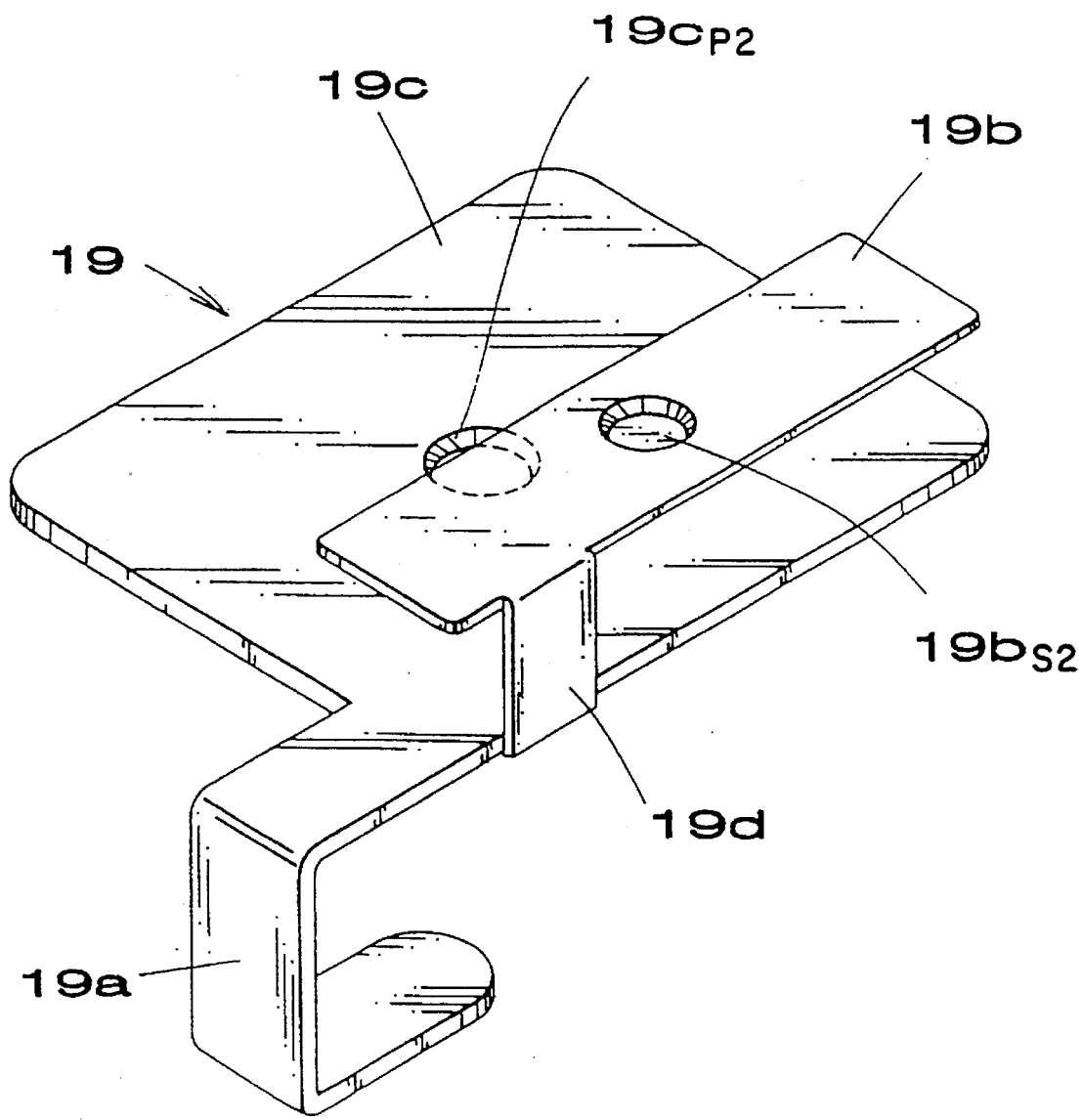
FIG. 7 is a schematic perspective view showing the output terminal member which may be used in the embodiment of FIGS. 4 to 6.

As illustrated in FIG. 7, the output terminal plate 19 comprises a connecting leg 19a which can be electrically connected to an output terminal of the external electric circuit, an oblong terminal segment 19b to be placed on the upper surface-electrode of the series resonator S2 and held in dose contact therewith, a square terminal segment 19c to be placed on the upper surface-electrode of the parallel resonator P2 and held in dose contact therewith and a connecting segment 19d bridging the segments 19b and 19c at a lateral side thereof. The connecting leg 19a is extended from a front comer of the square segment 19c. The terminal segment 19b has a raised connecting section $19b_{s2}$ projecting downward from the lower surface thereof in order to secure electric contact with the upper surface-electrode of the series resonator S2 while the terminal segment 19c has a raised connecting section $19c_{p2}$ also projecting downward from the lower surface thereof in order to secure electric contact with the upper surface-electrode of the parallel resonator P2.

Buffer plates 20 and 21 are arranged respectively between the input terminal plate 18 and the top wall of the casing 10 and between the output terminal plate 19 and the top wall of the casing 10.

In practice, the casing 10 is molded integrally with the grounded terminal plate 13 and the connecting terminal plate 16. Then, resonators are placed in position in the casing 10 through the opening 11 and the connecting legs 18a and 19a are made to project outward through the opening 11. Thereafter, an insulating shield plate 22 is fitted to the opening 11 of the casing 10 such that the connecting legs 18a and 19a pass through respective oblong slits 23 and 23 (one of them being shown in FIG. 5) of the shield plate 22 and then the entire apparatus is hermetically sealed by injecting a sealing resin material 24 such as epoxy resin to produce a completed ladder type electric filter F. Each of the connecting legs 18a and 19a and the connecting leg 13a of the grounding terminal plate 13 is bent twice along the casing 10 such that its free end is located directly under the bottom of the casing 1. With this arrangement, the filter F is ready to be mounted on a printed-circuit board not shown.

Thus, the ladder type electric filter F is provided with the input terminal plate 18, the output terminal plate 19 and the grounding terminal plate 13 that are externally exposed. So, a filter circuit having a desired circuit configuration can be realized by simply connecting the exposed terminal plates of a given number of unit filter circuits as shown in FIG. 10 to respective electric circuit portions of a printed-circuit board by soldering or some other appropriate bonding means.

Now, the principal components of the filter will be described.

The raised connecting sections $19c_{p2}$, $13_{p2}$, $14_{p1}$ and $16b_{p1}$ of each of the terminal plates 19, 13, 14 and 16 are aligned with the centers of the parallel resonators P1 and P2 as shown in FIG. 5.

Figure 1:
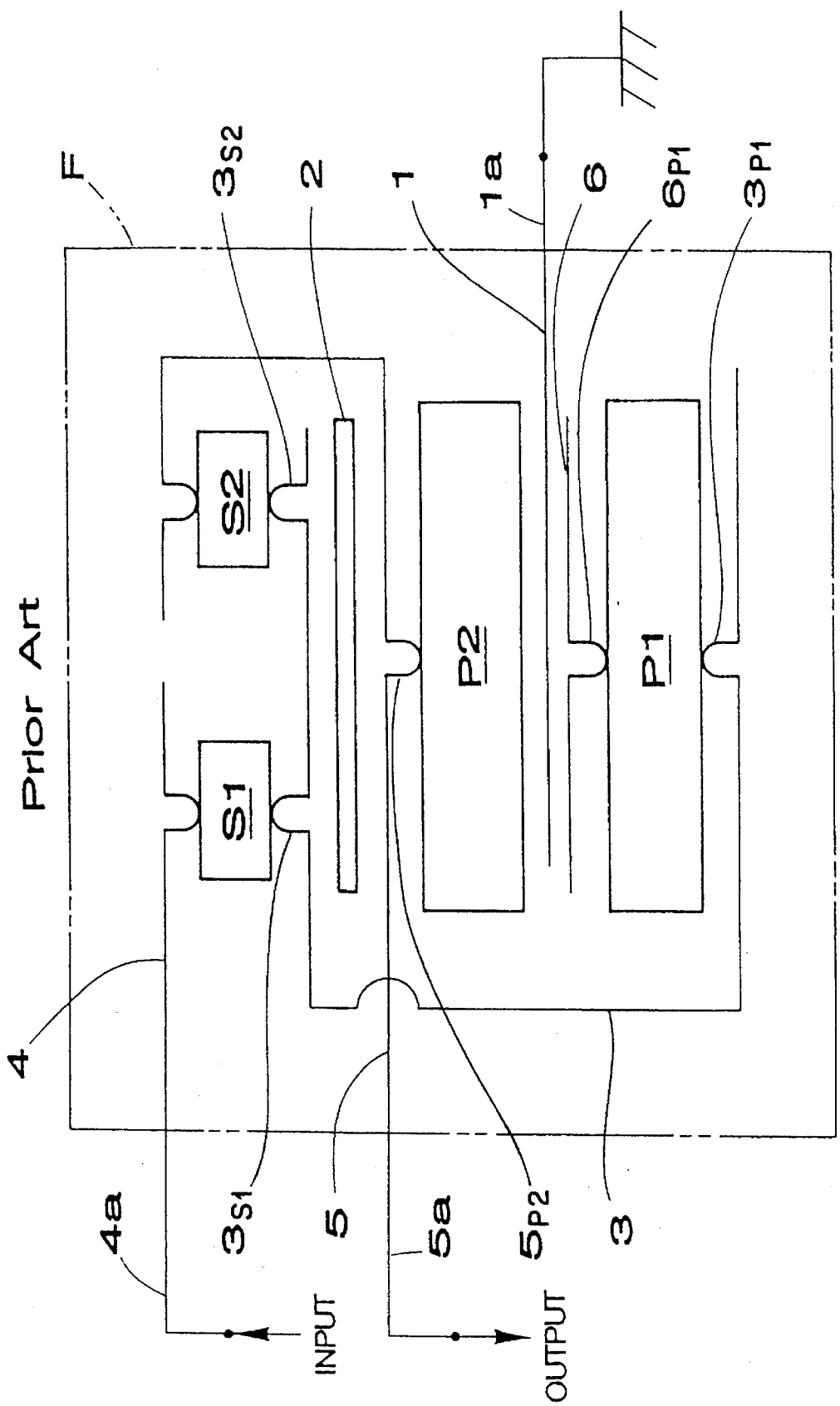
FIG. 1 is a schematic view showing a conventional ladder type electric filter to which the present invention is applied.
Figure 2:
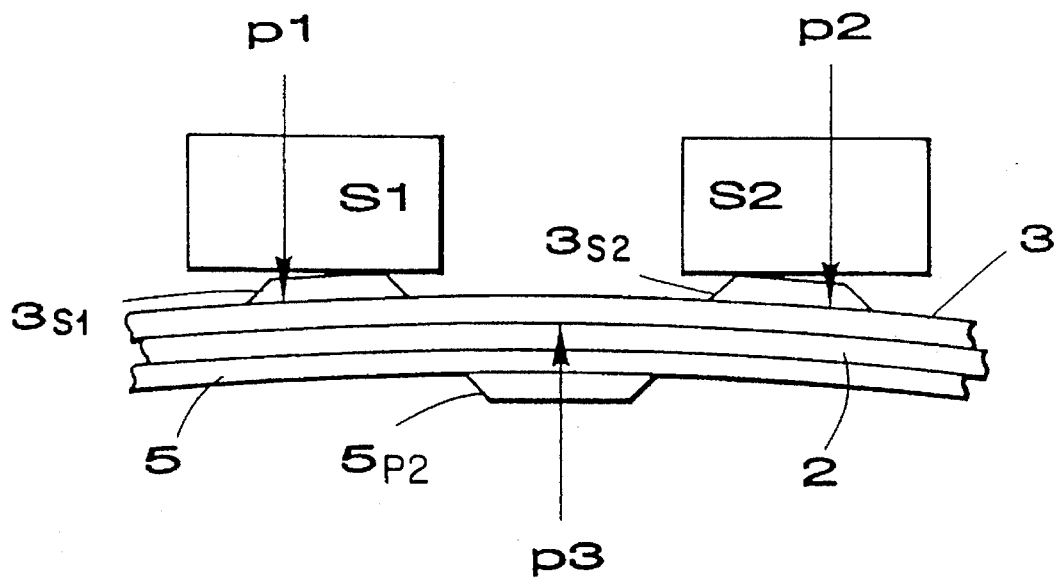
FIGS. 2 and 3 are schematic partial side views illustrating the problems associated with the conventional ladder type electric filter.
Figure 3:
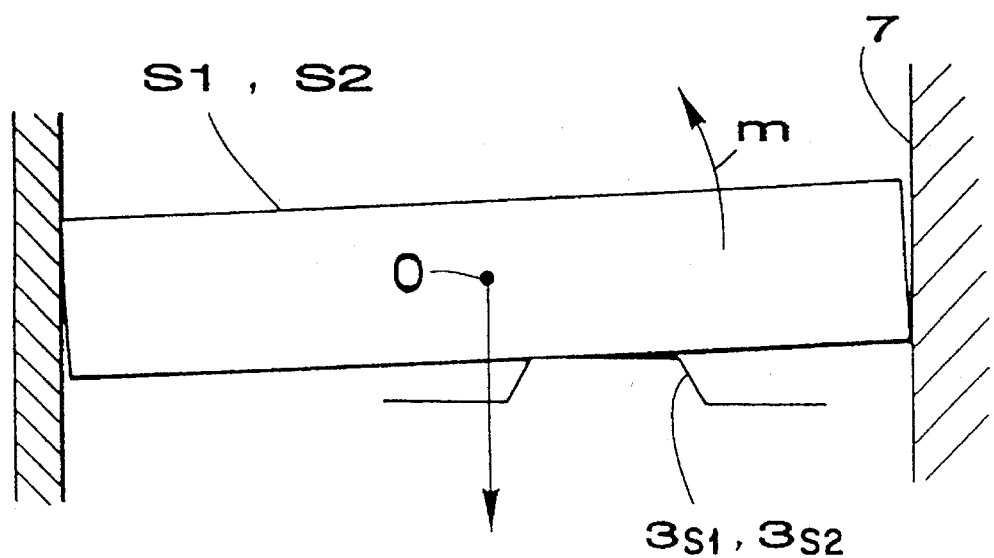

On the other hand, the raised connecting sections $16a_{s1}$ and $16a_{s2}$ formed on the terminal segment 16a of the connecting terminal plate 16 are arranged laterally off the raised connecting sections $19c_{p2}$, $13_{P2}$, $14_{p1}$ and $16b_{P1}$ and aligned respectively with the centers of the series resonators S1 and S2 so that the raised connecting sections $16a_{s1}$ and $16a_s$ are to be held in dose contact with the series resonators S1 and S2. Thus, if the abutting surfaces of the raised connecting sections $16a_{s1}$, $16a_{s2}$ and $19c_{p2}$ are laterally spaced apart from one another as shown in FIG. 2, pressures p1 and p2 are applied respectively to the terminal segment 16a respectively by way of the raised connecting sections $16a_{s1}$ and $16a_{s2}$ that are held in close contact with the respective series resonators S1 and S2 while pressure p3 is applied to the center of the terminal segment 16a by way of the adjoining terminal segment 19c and the raised connecting section $19c_{p2}$ to warp the terminal segment 13a with the center thereof acting as the fulcrum and consequently displace the raised connecting sections $16a_{s1}$ and $16a_{s2}$ in terms of electric connection to degrade the resonating characteristic of the resonators.

Figure 8:
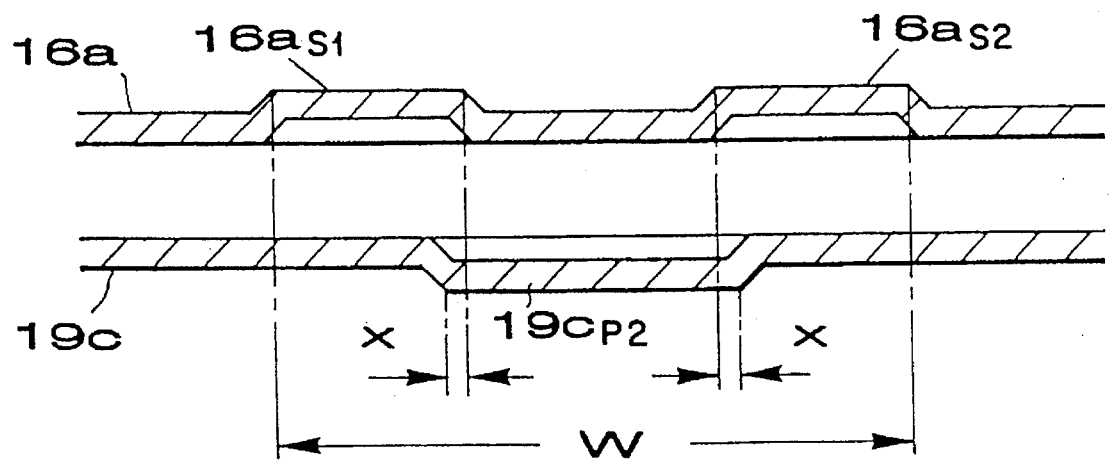
FIG. 8 is an enlarged partial section view showing the positional relationship between the raised connection portions of the connecting terminal plate and the raised connecting portion of the output terminal plate in the embodiment of FIGS. 4 to 6.

This problem can be avoided by making the abutting surfaces of the raised connecting sections $16a_{s1}$ and $16a_{s2}$ of the terminal segment 16a and the abutting surface of the raised connecting section $19c_{p2}$ disposed on the lower surface of the terminal segment 19c have a large surface area so that the abutting surfaces of the raised connecting sections $16a_{s1}$ and $16a_{s2}$ partly overlap with the abutting surface of the raised connecting section $19c_{p2}$ of the terminal segment 19c, if seen from above, to produce overlapped areas x and x as shown in FIG. 8.

Figure 9:
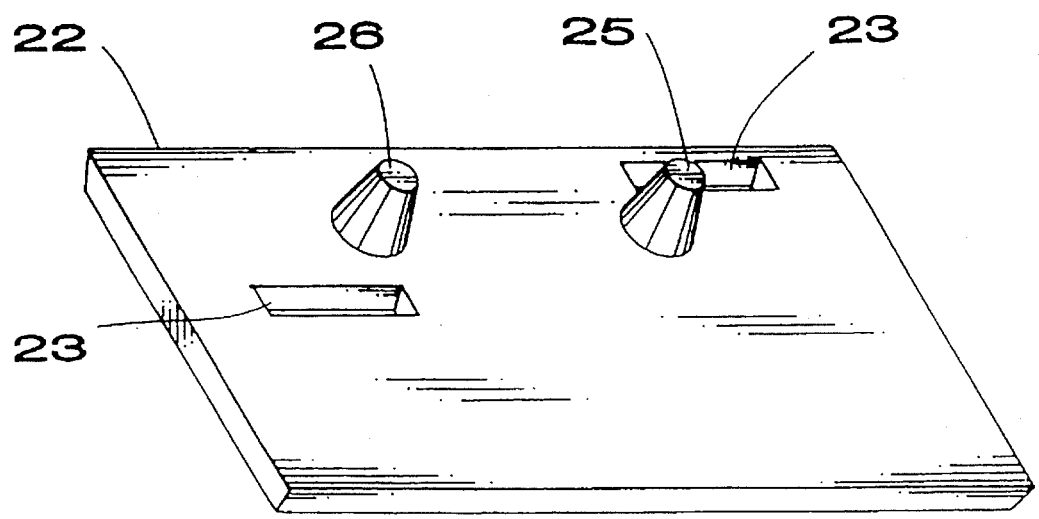
FIG. 9 is a schematic perspective view showing the insulating shield plate which may be used in the embodiment of FIGS. 4 to 6.

On the other hand, the insulating shield plate 22 for the opening 11 of the casing 10 has frusto-conical position controlling projections 25 anf 26 projecting respectively into the space regions 12a and 12b as shown in FIG. 9. The insulating shield plate 22 is made of an insulating material such as nylon and, as described earlier, provided with the oblong slits 23 and 23. The position controlling projections 25 and 26 have respective lengths that are adapted to the corresponding lengths of the series resonators S1 and S2. More specifically, the series resonators S1 and S2 are caused to have respective electrostatic capacities that are slightly different from each other by differentiating their lengths. Thus, the series resonators S1 and S2 are so positioned that their centers O and O are aligned with the raised connecting sections that are by turn laterally aligned with the centers of the parallel resonators P1 and P2 by positionally differentiating the rear end walls 12c and 12d of the space regions 12a and 12b and utilizing the position controlling projections 25 and 26. Since the series resonators S1 and S2 have respective lengths that are slightly different from each other, the alignment of the series resonators S1 and S2 can alternatively be achieved by selecting appropriate lengths for the respective position controlling projections 25 and 26.

With the above described arrangement of the components of the filter, where the abutting surfaces of the raised connecting sections $16a_{s1}$ and $16a_{s2}$ partly overlap with the abutting surface of the raised connecting sections $19c_{p2}$, if viewed from above, if the components of the filter that are layered in the casing 10 are subjected to pressure, it is evenly applied to the terminal segment 16a of the connecting terminal plate 16 within the overall width including the laterally arranged raised connecting sections $16a_{s1}$ and $16a_{s2}$ so that the connecting terminal plate 16 would not be warped to degrade the performance of the filter.

Additionally, since the centers of the series resonators S1 and S2 and the parallel resonators P1 and P2 as well as the raised connecting sections $16a_{s1}$, $16a_{s2}$ and $19c_{p2}$ are longitudinally aligned, the resonators are not subjected to torque even if pressure is applied thereto so that they can remain stably within the casing and degradation of the performance of the filter can be minimized.

As described above in detail with regard to the first aspect of the invention, since the abutting surfaces of the raised connecting sections $16a_{s1}$ and $16a_{s2}$ that are held in close contact with the respective lower surface-electrodes of the series resonators S1 and S2 partly overlap with the abutting surface of the raised connecting section $19c_{p2}$ in areas x and x, if viewed from above, the connecting terminal plates are subjected to even pressure if pressures are locally applied thereto between the two raised connecting sections $16a_{s1}$ and $16a_{s2}$ so that consequently the connecting terminal plates would never be warped and hence the resonating performance of the filter as a whole would not be degraded. Consequently, there can be provided a ladder type electric filter F that has a reduced size and at the same operates excellently if it comprises a pair of vertically arranged parallel resonators P1 and P2 and a pair of series resonators S1 and S2 arranged side by side above said parallel resonators as a conventional filter of the same type.

Furthermore, with the arrangement described above with regard to the second aspect of the invention, since the centers of the series resonators S1 and S2 are longitudinally aligned with the centers of the parallel resonators P1 and P2 by controlling the locations of the rear end walls of the space regions of the casing where the series resonators S1 and S2 are contained and those of the free ends of the position controlling projections and the raised connecting sections of the terminal plates are arranged such that they are held in longitudinal alignment with the centers of the resonators in order to secure electric connection with the corresponding resonators, the resonators would never be subjected to a torque if pressures are applied to the resonators.

We claim:

1. A ladder type electric filter comprising:

a pair of square shape parallel resonators which are arranged vertically as an upper and a lower parallel resonator, each being provided with an upper and lower surface-electrode;

a pair of strip shape series resonators which are horizontally juxtaposed on the upper parallel resonator of said parallel resonators, each being provided with an upper and lower surface-electrode;

an input terminal member connected to the upper surface-electrode of one of said series resonators;

an output terminal member connected to the upper surface-electrode of the other of said series resonators and the upper surface-electrode of the upper parallel resonator;

a grounded terminal member connected to the lower surface-electrodes of the upper parallel resonator and the upper surface-electrode of the lower parallel resonator;

a connecting terminal member for connecting the upper surface-electrode of the series resonators with the lower surface-electrode of the lower parallel resonator; and a casing for containing said parallel resonators and said series resonators and said terminal members and having an opening to be hermetically sealed by an insulating shield member;

wherein said connecting terminal member is provided with a pair of raised connecting sections arranged side by side and having respective abutting surfaces to be held in close contact with the lower surface-electrodes of said series resonators;

wherein said output terminal member is provided with a raised connecting section and having a contacting surface to be held in close contact with the center of the upper surface-electrode of the upper parallel resonator; and wherein the raised connecting sections of said connecting terminal member and the raised connecting section of said output terminal member are arranged so that the abutting surfaces of said connecting terminal member only partly overlap with the contacting surface of said output terminal member as viewed from above.

2. A ladder type electric filter as claimed in claim 1, wherein said parallel resonators are intended to be operated in a contour oscillation mode, said series resonators are intended to be operated in a longitudinal oscillation mode, and said input, output and grounded terminal members having respective connecting legs which are outwardly extended through the slits of said insulating shield member.

3. A ladder type electric filter comprising:

a pair of square shape parallel resonators which are arranged vertically one above the other, each being provided with an upper and lower surface-electrode;

a pair of strip shape series resonators which are horizontally juxtaposed on the upper parallel resonator, each being provided with an upper and lower surface electrode;

an input terminal member;

an output terminal member;

a grounded terminal member;

a connecting terminal member; and a casing for containing said parallel resonators and said series resonators and said terminal members and having an opening to be hermetically sealed by means of an insulating shield member;

wherein said insulating shield member is provided with position controlling projections intended to be held in abutment with the respective end portions of said series resonators disposed close to the opening of the casing for positioning said series resonators so that the centers of said series resonators along the longitudinal axes thereof are substantially aligned with the center of the upper parallel resonator along the longitudinal axis thereof; and wherein the raised connecting sections of the terminal plates are arranged such that said raised connecting sections are held in alignment with the centers of the resonators.

4. A ladder type electric filter as claimed in claim 3, wherein said parallel resonators are intended to be operated in a contour oscillation mode, the lower surface-electrode of the upper parallel resonator and the upper surface-electrode of the lower parallel resonator are electrically connected with each other by said grounded terminal member, said series resonators are intended to be operated in a longitudinal oscillation mode, the lower surface-electrodes of said series resonators are connected to the lower surface-electrode of the parallel resonator arranged at the bottom by said connecting terminal member, the upper surface-electrode of one of the series resonators is electrically connected to said input terminal member, the upper surface-electrode of the other series resonator is electrically connecting to the upper surface-electrode of the upper parallel resonator by said output terminal member, and said input, output and grounded terminal members having respective connecting legs which are outwardly extended through the slits of said insulating shield member.

5. A ladder type electric filter as claimed in claim 3, wherein said position controlling projections of said insulating shield member have a free end for bounding a front end of each of the spaces of the casing where said series resonators are contained.

* * * * *